United States Patent [19]

Stewart

[11] Patent Number: 5,268,033
[45] Date of Patent: * Dec. 7, 1993

[54] TABLE TOP PARYLENE DEPOSITION CHAMBER

[76] Inventor: Jeffrey Stewart, 690-D Avenida Sevilla, Laguna Hills, Calif. 92653

[*] Notice: The portion of the term of this patent subsequent to Aug. 7, 2007 has been disclaimed.

[21] Appl. No.: 723,841

[22] Filed: Jul. 1, 1991

[51] Int. Cl.$^5$ ............................................. C23C 16/00
[52] U.S. Cl. .................................... 118/719; 118/715; 118/724; 118/726; 118/728; 118/730; 427/255.6; 219/390; 474/133
[58] Field of Search ............... 188/715, 719, 728, 730, 188/726, 724; 427/255.6; 219/390; 474/133

[56] References Cited

U.S. PATENT DOCUMENTS

| | | | |
|---|---|---|---|
| 3,288,728 | 1/1966 | Gorham | 528/86 |
| 3,300,332 | 1/1967 | Gorham | 423/274 |
| 3,385,953 | 5/1968 | Henneberger | 219/390 |
| 3,472,795 | 10/1969 | Tittman et al. | 528/396 |
| 3,503,903 | 3/1970 | Shaw et al. | 528/396 |
| 3,600,216 | 8/1971 | Stewart | 428/417 |
| 3,719,166 | 3/1973 | Gereth | 118/730 |
| 3,895,135 | 7/1975 | Hofer | 427/255.7 |
| 4,508,054 | 4/1985 | Baumberger et al. | 118/715 |
| 4,649,859 | 3/1987 | Wanlass | 118/715 |
| 4,683,143 | 7/1987 | Riley | 427/255.6 |
| 4,760,244 | 7/1988 | Hokynar | 219/390 |
| 4,945,856 | 8/1990 | Stewart | 118/715 |
| 5,030,810 | 7/1991 | Haley | 219/390 |
| 5,128,515 | 7/1992 | Tanaka | 219/390 |

FOREIGN PATENT DOCUMENTS

| | | | |
|---|---|---|---|
| 59-74629 | 4/1984 | Japan | 156/345 |
| 61-14195 | 1/1986 | Japan | |

OTHER PUBLICATIONS

Union Carbide Brochure, re Parylene Deposition Systems, 1979.

Primary Examiner—Richard Bueker
Attorney, Agent, or Firm—Stetina and Brunda

[57] ABSTRACT

Disclosed is a table top parylene deposition system wherein reactive monomer vapor enters a deposition chamber tangentially so as to create a rotational flow of vapor within the interior of the chamber. A substrate support fixture is positioned within the chamber and rotated in a direction counter to the rotational flow of vapor.

17 Claims, 4 Drawing Sheets

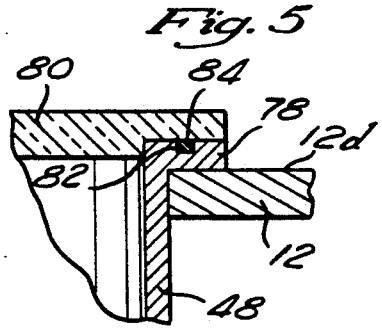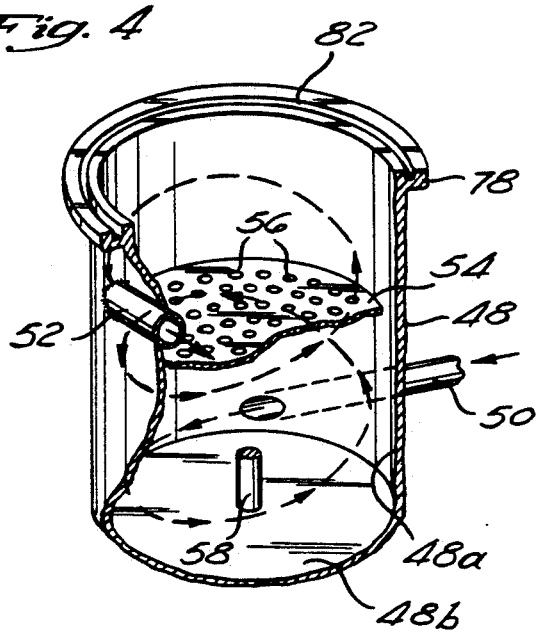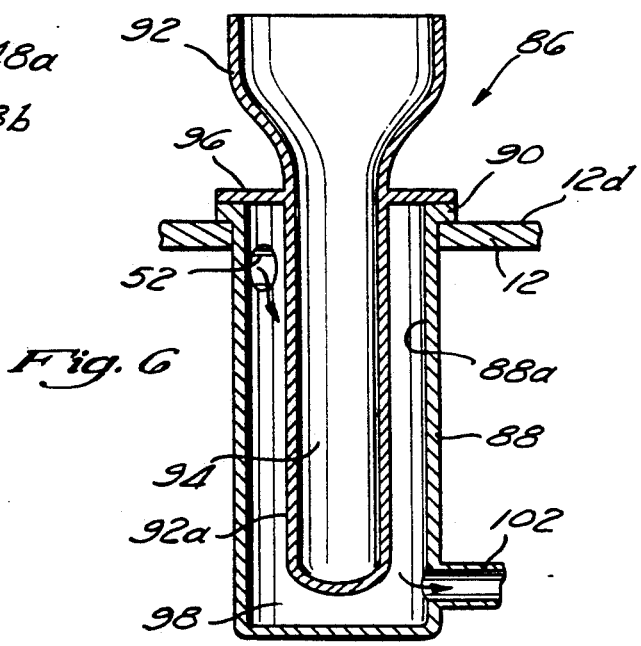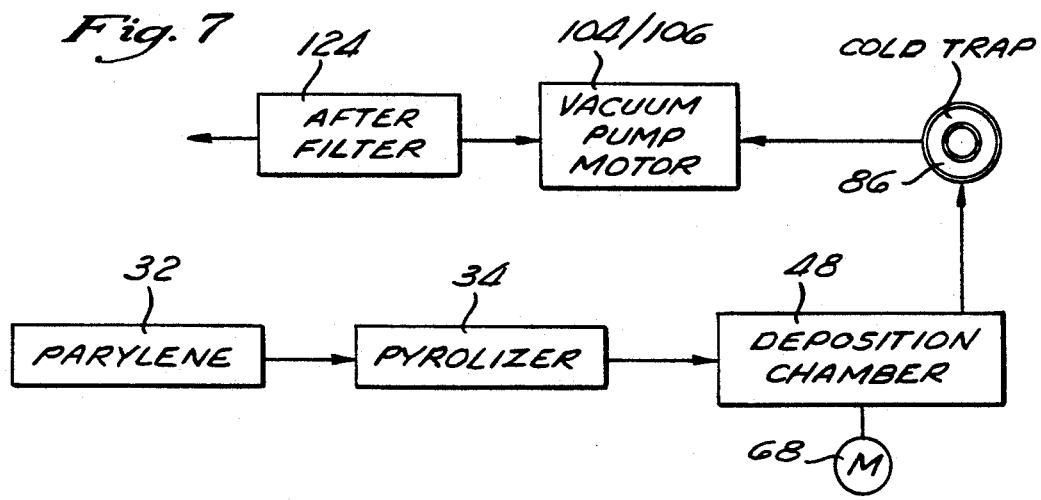

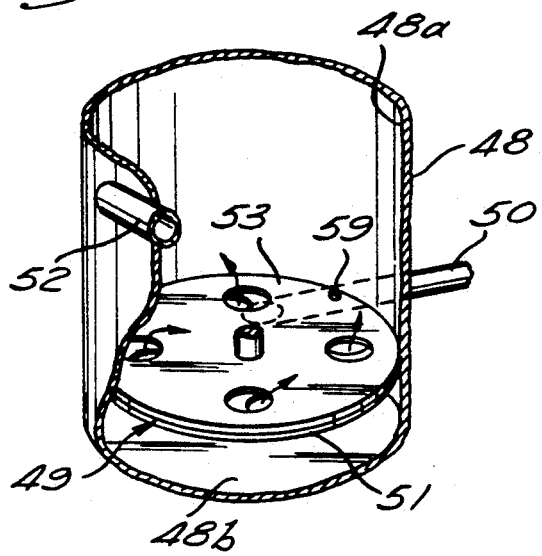
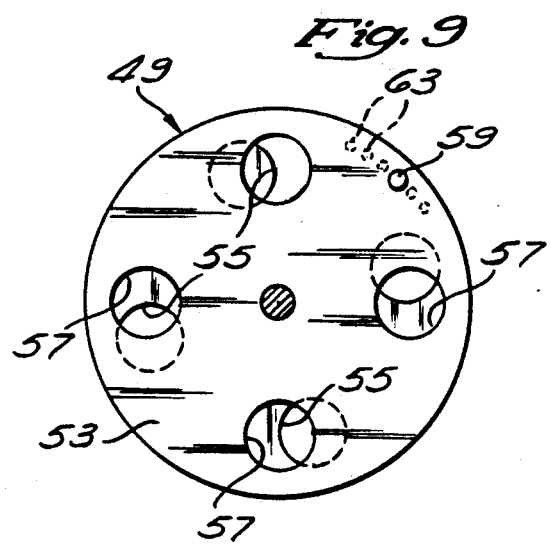
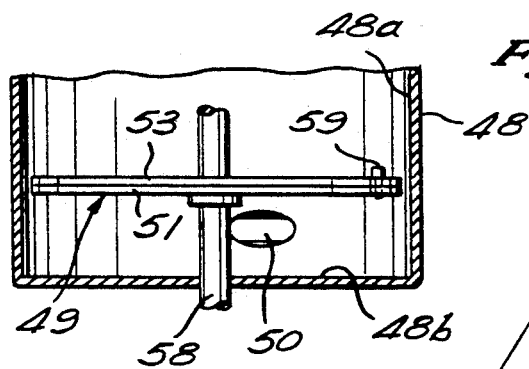
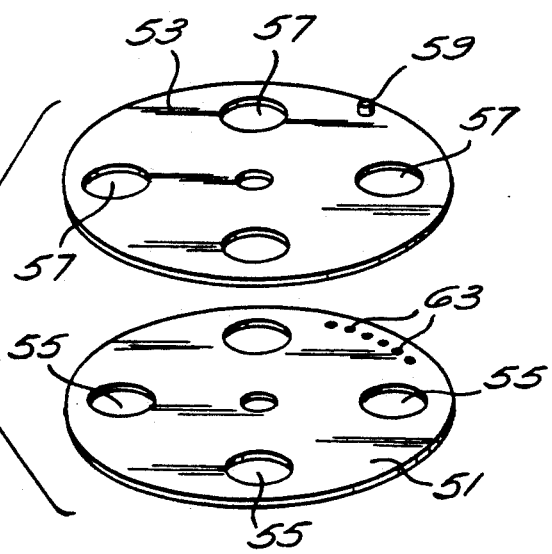
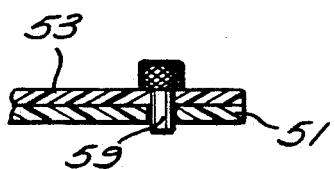

TABLE TOP PARYLENE DEPOSITION CHAMBER

FIELD OF THE INVENTION

The present invention relates generally to an improved device for use in depositing condensation coatings on various substrates. More particularly, the invention relates to an improved table top deposition chamber for depositing para-xylylene polymers on electrical component parts and the like.

BACKGROUND OF THE INVENTION

Para-xylylene polymers are employed as coatings for various electronic components due to their desirable physical and electrical properties. One advantage of polypara-xylylene coatings is that thin layers of such coatings are capable of exhibiting highly desirable physical and electrical properties. Because para-xylylene coatings are applied in very thin layers, heat tends to dissipate rapidly from the underlying components. Thus, the coated components cool down quickly and are less prone to temperature related degradation than similar components bearing other types of coatings.

In further contrast to conventional polymer coatings, para-xylylenes are generally not prepolymerized prior to application on the coatable substrates. This is because the para-xylylene polymers are not given to simple extrusion, melting or molding as are many of the conventional thermoplastics. Additionally, because the para-xylylenes are generally insoluble in commonly used organic solvents, it is impractical to employ traditional solvent deposition techniques for applying polyparaxylylene coatings.

Accordingly, in most commercial applications, para-xylylene polymers are deposited on desired substrates by a pyrolytic deposition process known specifically as the "parylene process." Such process begins with the vaporization of a cyclic di-para-xylylene dimer. The dimer is pyrolytically cleaved at temperatures of about 400 to 750 degrees C. to form a reactive para-xylylene monomer vapor. Thereafter, the reactive monomer vapor is transferred to a deposition chamber wherein the desired substrates are located. Within the deposition chamber, the reactive monomer vapor condenses upon the desired substrates to form a para-xylylene polymer or co-polymer film.

Any monomer vapor which fails to condense within the deposition chamber is subsequently removed by a cold trap which is maintained at approximately minus 70 degrees C.

The entire parylene process is generally carried out in a closed system under constant negative pressure. Such closed system may incorporate separate chambers for the (a) vaporization, (b) pyrolysis, and (c) deposition steps of the process, with such chambers being connected by way of appropriate plumbing or tubular connections.

A primary consideration in the parylene deposition process is the achievement of uniform coating thickness on the desired substrates. Unlike conventional polymer coating systems, the condensation deposition of parylene coatings is capable of depositing even ultra-thin films without running or uneven areas resulting upon the substrates, provided that the monomer vapor is homogeneously and evenly distributed on the surface of the substrate. Thus, the design and functioning of the deposition chamber is critical to the achievement of uniform vapor distribution with resultant even coating deposition. Another important consideration in the parylene deposition process is the minimization of waste. Because of the high costs associated with parylene raw materials, there exists substantial economic motivation to preserve and conserve the parylene materials during the coating process. One particular area in which a great deal of material is wasted is on the various internal structures of many prior art parylene deposition chambers. It must be appreciated that the condensation deposition of coatings is not substrate selective, i.e. the vapors have no way of seeking out only the desired substrates. Instead, the monomer vapor will condense and polymerize on any reduced temperature object with which it comes in contact. As a result, the entire inner surface of the chamber, and all of the objects positioned therein will become covered with the parylene coating. Thus, the interior of the chamber and any existing hardware must be cleaned periodically to remove the wasted parylene polymer.

The parylene deposition chambers employed in the prior art have generally provided less than optimal coating uniformity due to the inferior distribution and homogeneity of the vapor within the deposition chamber. Also, because of the particular chamber design, the prior art deposition chambers are associated with a great deal of waste of the parylene chemicals. Though many of the aforementioned deficiencies in prior art deposition chambers have been alleviated by the device disclosed in U.S. Pat. No. 4,945,856, issued to the subject applicant, this particular device in and of itself possesses certain deficiencies which detract from its widespread use.

Foremost of these deficiencies is the relatively high cost and large size of the parylene deposition chamber and the system with which it is utilized. Particularly, the system disclosed in U.S. Pat. No. 4,945,856 is modular in configuration and comprises an independent parylene deposition unit which is interfaced to and detachable from a pyrolytic generating unit. Though the modular construction of the device allows the units to be separated and allows the single pyrolytic vapor generating unit to be used with multiple interchangeable deposition chambers, the size of the combined units still makes set up of the system difficult, particularly in those environments where limited floor space if available. The present invention overcomes this particularly deficiency as well as the coating deficiencies associated with the prior art devices by providing a deposition chamber which is positionable upon a table top and is adapted to obtain uniform coating thickness while minimizing parylene polymer waste.

SUMMARY OF THE INVENTION

In accordance with the preferred embodiment of the present invention, there is provided a table top parylene deposition system. The system generally comprises a housing which is sized to be positionable upon a table top. Disposed within the housing is a vaporization chamber which is used for vaporizing a quantity of di-para-xylylene dimer. Also enclosed within the housing and connected to the vaporization chamber is a pyrolysis chamber which is connected to the vaporization chamber and used for pyrolyzing the vaporized dimer to form a reactive monomer vapor.

The present invention further comprises a deposition chamber which is disposed within the housing and comprises a tank-like chamber body having a floor, a cylindrical wall, and a lid positionable thereon which is alternately movable between a closed position and an open position. The deposition chamber is connected to the pyrolysis chamber such that the monomer vapor enters tangentially near the bottom of the chamber through a tangentially connected monomer inlet line. The monomer vapor exits the deposition chamber through a monomer outlet line which like the inlet line is also tangentially connected to the deposition chamber. Such tangential entry and exit of the monomer vapor results in a generally annular rotational flow path of the vapors as they rise axially through the inner confines of the deposition chamber. The flow of monomer vapor through the deposition chamber is facilitated by a vacuum pump which is disposed within the housing and connected to the deposition chamber. In the preferred embodiment, the vacuum pump maintains continual negative pressure on the system such that the monomer vapor will flow through the deposition chamber in the aforementioned manner.

The present invention further comprises a substrate support fixture which is positioned centrally within the deposition chamber. As the flow of monomer vapors rises within the inner confines of the deposition chamber, the support fixture is rotated, preferably in a direction opposite the rotational flow of the entering vapors. Also, the fixture is specifically sized such that an annular space exists between the outer edges of the rack and the inner wall of the chamber. The provision of such annular space provides for an even flow of vapor around the fixture. In the preferred embodiment, the substrate support fixture comprises a multi-tiered rack having a plurality of substrate support shelves positioned horizontally therewithin. Each such substrate support shelf is provided with a multiplicity of perforations through which the monomer vapor may flow. Such perforations further enhance the degree of permeation and evenness of the vapor flow within the deposition chamber. In the preferred embodiment, the support shelf disposed closest the inlet line, i.e. the lower most support shelf, includes a secondary plate connected thereto in a manner wherein the secondary plate is rotatable relative the underlying shelf. The secondary plate includes a plurality of large diameter apertures which are oriented in a pattern identical to the aperture pattern of the underlying support shelf. By rotating the secondary plate relative the underlying support shelf, the area of the apertures within the support shelf through which the monomer vapors pass during deposition upon the substrates may be adjusted so as to selectively control the impedance to the monomer vapor flow. Additionally, the substrate support fixture is preferably pivotally connectable to the floor of the chamber, thereby providing a support for the substrate support fixture so as to prevent lateral movement or shifting thereof and avoiding any resultant contact between the edges of the support fixture with the surrounding deposition chamber wall.

The means used to rotate the substrate support fixture within the deposition chamber comprises a shaft which is attached to the substrate support fixture and extends downwardly through the floor of the chamber. Attached to the lower end of the shaft is a timing pulley which includes a drive belt disposed about the periphery thereof. A drive shaft is also interfaced to the drive belt in a manner wherein the rotation of the drive shaft causes the rotation of the pulley. Connected to the drive shaft opposite the end interfaced to the drive belt is a motor. In the preferred embodiment the motor is pivotally mounted within the housing so as to be movable between the drive position whereat the drive belt is maintained in tension between the shaft and the pulley, and a relaxed position whereat the drive belt is removable from the drive shaft and the pulley.

In the preferred embodiment, the pyrolysis chamber comprises a length of stainless steel pipe or tubing which extends between the vaporization chamber and the deposition chamber. As will be recognized, the tubing is adapted to permit the vaporized dimer to flow therethrough. Positioned about the length of the tubing is a split heater. The split heater comprises a bottom member and a top member, each of which define an elongate trough extending therethrough and a plurality of heating elements disposed adjacent the respective troughs. When the bottom member and top member are abutted against each other, the trough disposed therein form an aperture which is adapted to receive the length of tubing. Advantageously, the split configuration of the heater allows maintenance procedures to be conducted easily and quickly.

The present system further includes a programmable central processing unit which is disposed within the housing and is used for controlling various operations of the system. Particularly, the processing unit controls the operation of the pyrolysis chamber heater, fixture motor and vacuum pump thereby controlling the coating process for the substrates disposed on the support fixture.

It is an object of the present invention to provide a condensation coating deposition system which is sized and configured so as to be positionable upon a table top.

Another object of the present invention is to provide a condensation coating deposition system wherein improved vapor flow characteristics and design will result in uniform and even coating deposition, even at ultra-thin film thicknesses.

Another object of the present invention is to provide a condensation coating deposition system which will prevent waste of chemicals by avoiding the need for certain space occupying objects, such as baffles, which increase the surface area within the chamber.

A further object of the present invention is to provide a condensation coating deposition system which includes a substrate support fixture capable of being rotated within the deposition chamber so as to subject each substrate to uniform vapor concentrations and conditions.

BRIEF DESCRIPTION OF THE DRAWINGS

These as well as other features of the present invention will become more apparent upon reference to the drawings wherein:

FIG. 4 is a cutaway view illustrating the flow of characteristics of monomer vapor through the deposition chamber of the present invention;

FIG. 5 is a partial cross-sectional view illustrating the manner in which the lid is sealed to the deposition chamber of the present invention;

FIG. 6 is a cross-sectional view of the cold trap of the present invention;

FIG. 7 is a schematic diagram of the components comprising the parylene coating system of the present invention;

FIG. 8 is a cutaway view of the vaporization chamber of the present invention, further illustrating the lower most shelf of the substrate support fixture therein;

FIG. 9 is a top view of the lower most shelf of the substrate support fixture;

FIG. 10 is an exploded view of the lower most shelf of the substrate support fixture;

FIG. 11 is a side view of the lower most shelf of the substrate support fixture as positioned within the deposition chamber; and FIG. 12 is a partial cross-sectional view of a locating pin used to index the plates comprising the lower most shelf of the substrate support fixture relative one another.

DETAILED DESCRIPTION OF THE PREFERRED EMBODIMENT

Figure 1:
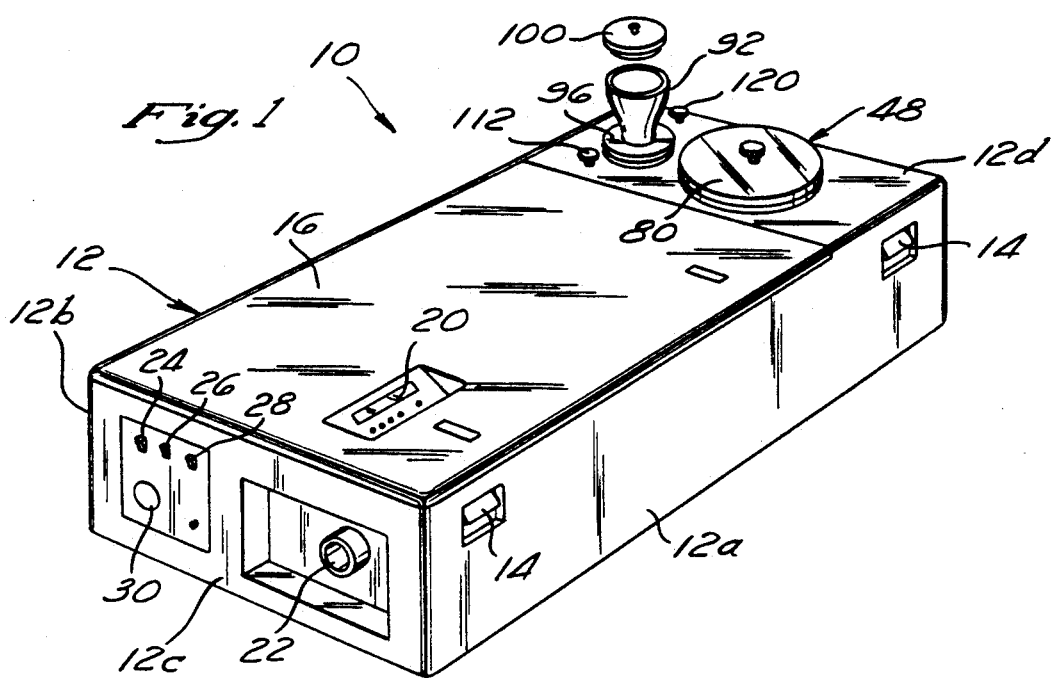
FIG. 1 is a perspective view of the table top parylene coating system of the present invention.
Figure 2:
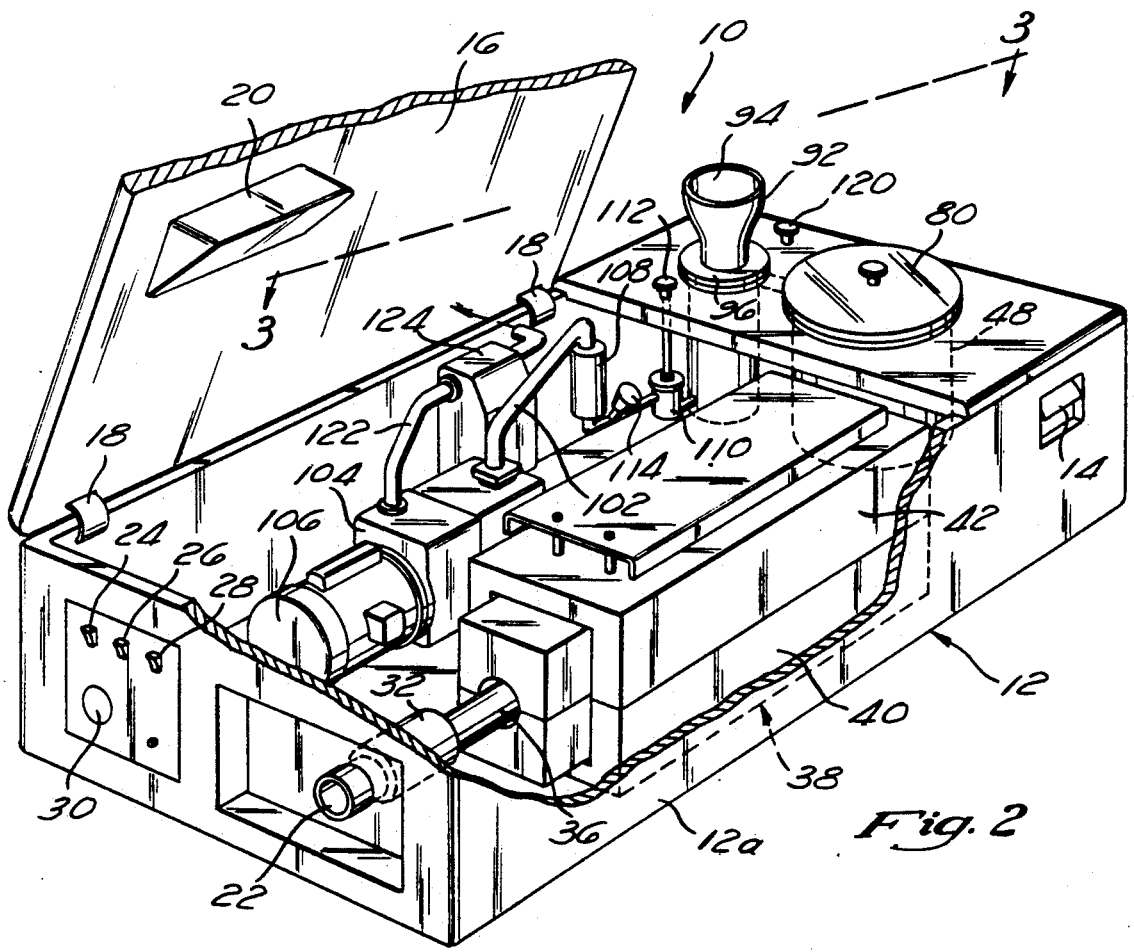
FIG. 2 is a perspective view illustrating the components disposed within the system housing.

Referring now to the drawings wherein the showings are for purposes of illustrating a preferred embodiment of the invention only and not for purposes of limiting the same, FIG. 1 is a perspective view of the table top parylene deposition system 10 of the present invention. In the preferred embodiment, deposition system 10 generally comprises a housing 12 which is sized and configured to be positionable upon a table top. In the preferred embodiment, housing 12 preferably has a length of approximately 4 feet, a width of approximately 2 feet and a height of approximately 1 foot. Disposed within the front surface 12a and back surface 12b of housing 12 are handles 14 which are used to carry deposition system 10. Though not shown, the handles 14 disposed within back surface 12b are disposed in an orientation identical to handles 14 within front surface 12a. As best seen in FIG. 2, housing 12 further includes a cover 16 attached thereto by hinges 18. As will be recognized, cover 16 is movable to the open position shown in FIG. 2, for purposes of gaining access to the various components disposed within the interior of housing 12. Included within cover 16 is a display screen 20 which is electrically interfaced to various components disposed within the housing 12. The display screen 20 is used to provide information to the system user in a manner which will be described below. Disposed within the left side surface 12c of housing 12 is an entrance port 22 which is used to introduce parylene raw material, i.e. di-paraxylylene dimer into the deposition system 10. Also included on left side surface 12c are switches 24, 26 and 28, the use of which will be discussed in greater detail below. Additionally, an opening 30 is disposed within left side surface 12c and is used for passing electrical wires into the interior of housing 12 for purposes of providing power to the various components disposed therein.

As seen in the schematic shown in FIG. 7, the major components of the deposition system 10 include the vaporizer, the pyrolyzer, the deposition chamber (including the motor attached thereto), the cold trap, the vacuum pump/motor and the after filter. In the following discussion pertaining to these components, it will be recognized that the vaporizer, pyrolyzer, chamber motor, vacuum pump/motor and after filter are completely enclosed within the housing 12. In this respect, such components may only be accessed by opening cover 16. The deposition chamber and cold trap, though also being disposed within the housing 12, include portions which extend outwardly from the housing 12.

Figure 3:
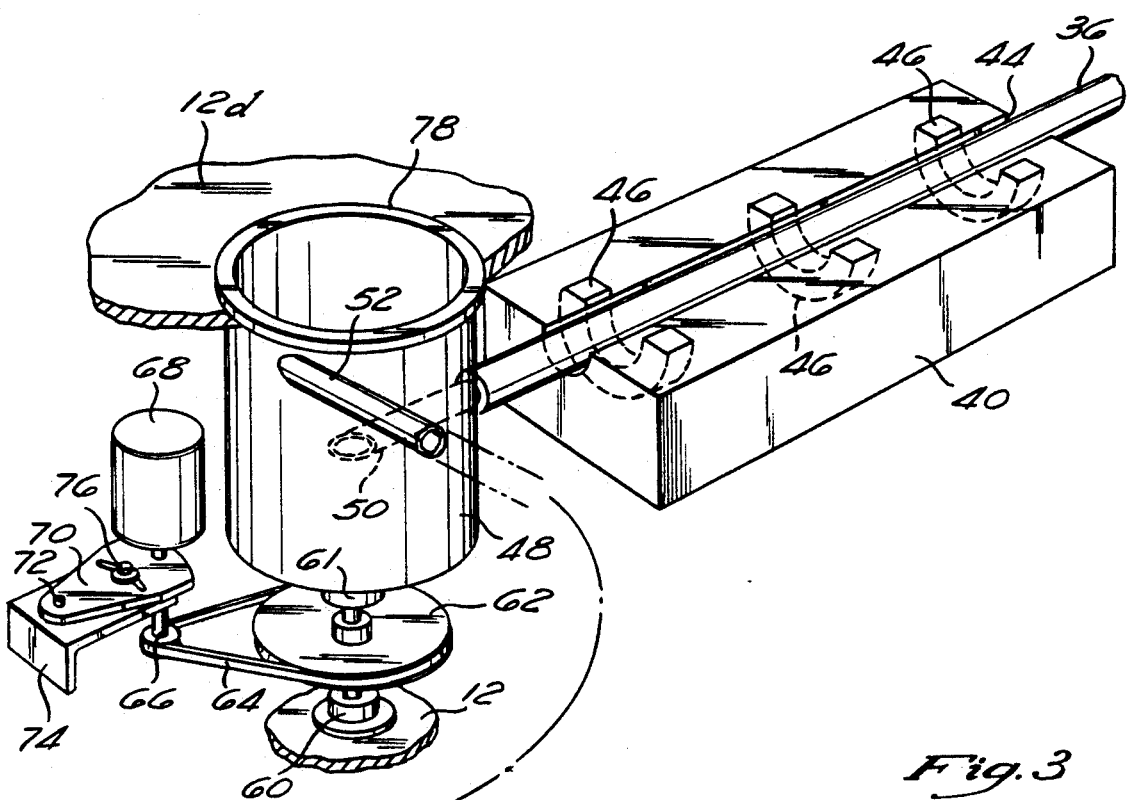
FIG. 3 is a perspective view taken along line 3—3 of FIG. 2.
Figure 3:
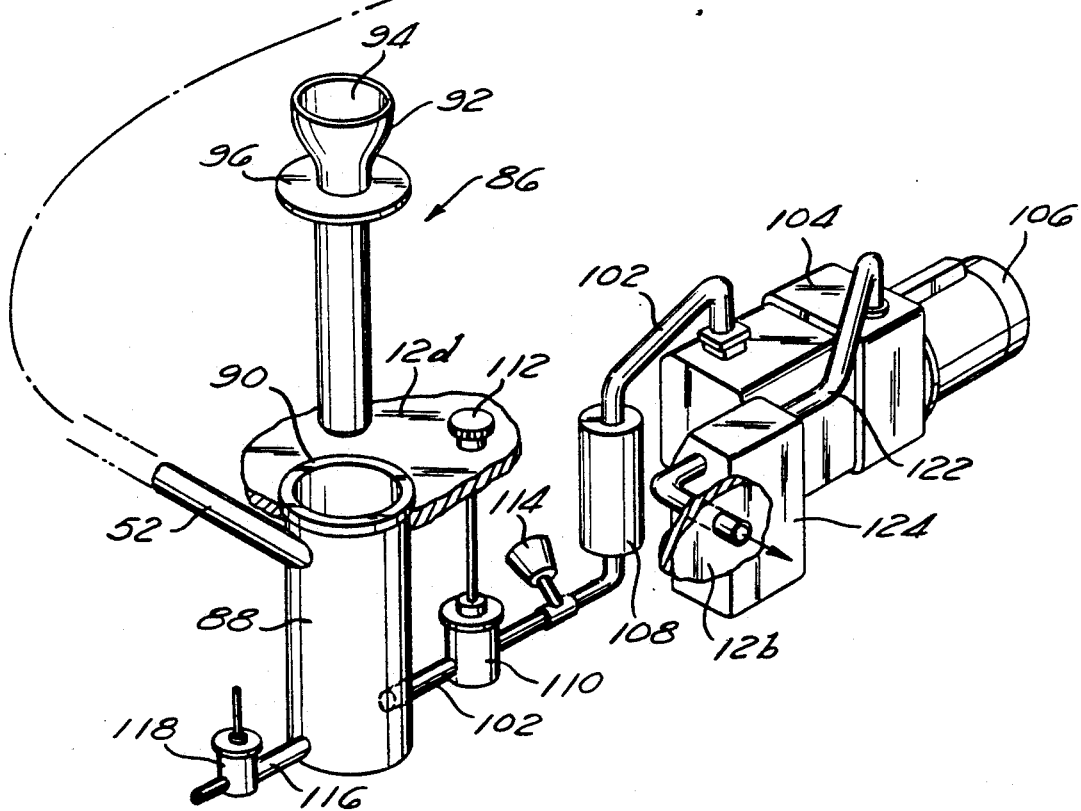

Referring now to FIG. 2, connected to entrance port 22 is a vaporization chamber 32 (i.e. the vaporizer). As will be recognized, parylene raw material inserted into the deposition system by way of entrance port 22 is fed into the vaporization chamber 32. Vaporization chamber 32, which includes heating elements associated therewith, provides a zone wherein a quantity of di-para-xylylene dimer is initially vaporized at elevated temperatures. Though not shown, after the dimer is inserted into vaporization chamber 32 via entrance port 22, a sealing cap is placed upon entrance port 22. Like the vaporization chamber 32, the sealing cap also includes heating element associated therewith. In this respect, the heating elements of the vaporization chamber 32 and sealing cap are operable to initiate the sublimation of the dimer as will be discussed in greater detail below. The vaporized dimer exits the vaporization chamber 32 and enters the pyrolysis chamber 34 (i.e. the pyrolyzer). As seen in FIGS. 2 and 3, in the preferred embodiment, the pyrolysis chamber 34 comprises a length of tubing 36 which is connected to vaporization chamber 32. Positioned about the tube 36 is a heater 38. Importantly, heater 38 is a split heater which comprises a bottom member 40 and a top member 42. As seen in FIG. 3, bottom member 40 includes a semi-circular trough 44 extending therethrough which is adapted to partially receive tube 36. Disposed adjacent trough 44 are electric heating elements 46. Though not shown, top member 42 has a configuration substantially identical to bottom member 40. Thus, as can be appreciated, when bottom member 40 and top member 42 are abutted against one another, the trough 44 and the trough disposed within top member 42 combine to form an aperture which is sized and configured to receive the tube 36. The split configuration of heater 38 allows for quick and easy access to tube 36 for maintenance purposes. As the vaporized dimer is transferred from vaporization chamber 32 into pyrolysis chamber 34, the dimer is pyrolyzed at temperatures of about 400 to 750 degrees C. by heating elements 46 to form the desired para-xylylene monomer.

The end of tube 36 opposite that connected to vaporization chamber 32 is connected to a deposition chamber 48 via an inlet line 50. Thus, following pyrolysis, the reactive monomer vapor is transferred from pyrolysis chamber 34 into deposition chamber 48 through inlet line 50. Importantly, inlet line 50 is interfaced to deposition chamber 48 such that the monomer vapor will enter the chamber 48 tangentially near the bottom of the chamber 48. As will be recognized, such tangential entry creates a rotary vapor flow pattern within the chamber 48. Also connected to deposition chamber 48 is an outlet line 52. Similar to inlet line 50, outlet line 52 is tangentially interfaced to deposition chamber 48 near the top of the chamber 48. Accordingly, as seen in FIG. 4, a rotary vapor flow pattern is achieved within deposition chamber 48 which travels in an upwardly, generally counterclockwise direction. Various studies have established that reactive parylene monomer vapor tends to settle somewhat in the earth's gravitational field, just as predicted by the kinetic theory of gases. In this respect, the vapor density of the parylene monomer tends to increase with depth in the chamber. As a result, parylene is generally deposited to greater thicknesses nearer the bottom of the chamber than the top. In the present deposition chamber, the deposition of parylene in greater concentrations near the bottom of the chamber 48 is overcome by having the inlet line 50 interfaced adjacent the bottom of the chamber 48 such that the vapor flow pattern travels upwardly.

In the preferred embodiment, positioned within the center of the deposition chamber 48 is a substrate holding fixture. Though not completely shown, the substrate holding fixture preferably comprises a plurality of support shelves such as 54 which are used to hold the desired substrate. Each of the shelves 54 preferably include a plurality of perforations 56 which enhance the degree of permeation and evenness of vapor flow within the chamber 48. Additionally, the overall diameter of each of the support shelves 54 is less than the inside diameter of chamber 48. Thus, when the substrate support fixture is disposed centrally within the chamber 48, there will remain an open annular space between the inner side wall 48a of chamber 48 and the outer circumference of the support fixture. Such space is particularly important in permitting the desired rotational or spiral flow of the vapors within the chamber 48.

In the preferred embodiment, each of the support shelves 54 is rotated in a direction opposite to the rotational direction of the vapor flow. In the embodiment shown, such rotational direction would therefore be in a clockwise direction. To facilitate the rotation of the holding fixture, the holding fixture is attached to a shaft 58 (partially shown in FIG. 4) which extends through the floor 48b of chamber 48. As seen in FIG. 3, shaft 58 is rotatably connected to the housing 12 by a bearing 60 and to the chamber 48 by a rotary vacuum seal 61. Attached to the middle portion of shaft 58 between chamber 48 and housing 12 is a timing pulley 62. Disposed about the periphery of timing pulley 62 is a drive belt 64. In addition to being interfaced to pulley 62, drive belt 64 is also interfaced to a drive shaft 66 which extends downwardly from a motor 68. Thus, as can be appreciated, the aotivation of motor 68 will subsequently cause the rotation of the support fixture within the deposition chamber 48. Motor 68, and more particularly drive shaft 66, is rotatably interfaced to a wedge-shaped swing plate 70. Swing plate 70 is in turn pivotally mounted via a pivot pin 72 to a mounting bracket 74 which is connected to the housing 12. As will be recognized, the pivoting of swing plate 70 in a direction away from pulley 62 will maintain the drive belt 64 in tension between the drive shaft 66 and the pulley 62. Additionally, swinging the swing plate 70 toward the pulley 62 will place drive belt 64 in a relaxed position thereby allowing drive belt 64 to be removed from drive shaft 66 and pulley 62. This particular adjustment feature may also be used to adjust the amount of tension exerted on drive belt 64. Swing plate 70 is maintained in a desired position through the use of a thumbscrew 76 which interconnects swing plate 70 to mounting bracket 74. It will be appreciated that alternative methods of rotating the support fixture within deposition chamber 48 may be utilized as an alternative to the aforementioned drive assembly.

Referring now to FIGS. 8-12, the lower most shelf 49 of the substrate support fixture disposed within the deposition chamber 48 is constructed in a manner differing from the remaining support shelves 54. Particularly, support shelf 49 comprises a lower fixture plate 51 having a secondary plate 53 abutted thereagainst and rotatably connected thereto. Secondary plate 53 preferably has a diameter equal to the diameter of fixture plate 51, but is constructed from a thinner material. Disposed within fixture plate 51 are a first set of large diameter apertures 55 while disposed within secondary plate 53 are a second set of large diameter apertures 57. Thus, as seen in FIG. 9, by rotating secondary plate 53 relative fixture plate 51, apertures 55 may be selectively aligned with apertures 57.

As will be recognized, varying the open area of apertures 55 within the shelf 49 serves to vary the amount of parylene vapor passing therethrough to the substrates. In certain deposition applications, it is sometimes desirable to alter the impedance to the flow of vapors through the deposition chamber. In this respect, if the deposition chamber is not fully loaded with substrates, or the configuration of the substrates does not provide a large surface area, the impedance to the flow of the vapors through the deposition chamber is preferably reduced. Such reduction is facilitated by rotating the secondary plate 53 relative the fixture plate 51 such that the apertures 55 and 57 are increasingly aligned. The reduction of impedance can affect the quality of the coating since the rate of deposition is increasing due to the increased vapor flow through the shelf 49. If the deposition rate is too high, the dwell time in the pyrolysis zone is shortened, thereby resulting in incomplete conversion from the dimer to the monomer stage. This results in a slightly cloudy coating film being deposited upon the substrate due to the dimer material, which is normally white, showing up in the film, which is normally clear. As such, the impedance can be increased by misaligning the apertures 55 and 57 in the manner shown in FIG. 9.

Once various impedance parameters have been established for certain substrates, repeatability is achieved through the utilization of a locating pin 59 disposed within the secondary plate 53. Locating pin 59 is received into a selected one of the apertures 63 disposed within the outer periphery of fixture plate 51. As such, by selectively placing the locating pin 59 into one of the apertures 63, the amount of vapor flow through the shelf 49 via the apertures 55 and 57 can be selectively controlled. To properly impede vapor flow, the support shelf 49 must be located adjacent the inlet line to the deposition chamber. Thus, as seen in FIGS. 8 and 11, the shelf 49 is the lower most shelf of the support fixture since the inlet line 50 is disposed adjacent the lower end of the deposition chamber 48. As will be recognized, if vapor inlet line 50 were disposed adjacent the top of the deposition chamber 48, support shelf 49 would comprise the upper most shelf of the substrate support fixture.

As seen in FIGS. 1-3, when deposition chamber 48 is disposed within housing 12, an outwardly extending flange 78 formed about the periphery of chamber 48 rests against the top surface 12d of housing 12. Positionable upon flange 78 is a lid 80 which is alternately movable between a closed position as shown in FIGS. 1 and 2 and an open position as seen in FIG. 3. Lid 80 is used to enclose the interior of chamber 48 during a substrate coating process. To facilitate the sealing of lid 80 against flange 78, disposed within flange 78 is an annular groove 82 which includes an O ring 84 disposed therein. As seen in FIG. 5, when lid 80 is abutted against flange 78, O ring 84 serves to create a seal between lid 80 and flange 78.

Referring now to FIGS. 3 and 6, outlet line 52 of deposition chamber 48 is connected to a cold trap 86. Cold trap 86 generally comprises a cylindrical container 88 having a configuration similar to chamber 48. In this respect, container 88 includes an outwardly extending flange 90 formed about the periphery thereof which, like flange 78 of chamber 48, is abutted against top surface 12d when container 88 is disposed within housing 12. Cold trap 86 further comprises a tubular member 92 which defines a reservoir 94 therewithin and includes a flange 96 extending outwardly therefrom. As seen in FIG. 6, tubular member 92 is lowered into container 88 until flange 96 abuts flange 90 of container 88. When flange 96 makes contact with flange 90, an annular space 98 is defined between the outer surface 92a of tubular member 92 and the inner surface 88a of container 88. As previously indicated, monomer vapor will condense and polymerize on any reduced temperature object with which it comes in contact. Thus, in the preferred embodiment, a material such as liquid nitrogen, carbon dioxide or helium is introduced into reservoir 94 of tubular member 92 after tubular member 92 has been introduced into container 88. The material is retained within reservoir 94 by a cap 100 which is positionable upon tubular member 92 and operable to enclose reservoir 94, as seen in FIG. 1. Importantly, tubular member 92 is constructed from a material adapted to permit a thermal transfer so as to cool the parylene vapor entering space 98 from outlet line 52, thereby causing any residual parylene not plated upon the substrates in chamber 48 to "plate out".

Connected to cold trap 86, and more particularly to container 88, is a first outlet line 102 which is in turn connected to a vacuum pump 104. Vacuum pump 104 is powered by a motor 106 which is attached directly thereto. As will be recognized, the aotivation of vacuum pump 104 by motor 106 maintains a continual negative pressure within the deposition system 10. Particularly, the operation of vacuum pump 104 causes parylene vapor to be drawn into deposition chamber via inlet line 50 and to be drawn out of deposition chamber via outline line 52. Because of tangential connection of the inlet line 50 and outlet line to deposition chamber 48, the vacuum existing at outlet line 52 causes the vapor to flow rotationally axially upwardly from the floor 48b of chamber 48. Additionally, the vacuum created by vacuum pump 104 is operable to draw the lid 80 downwardly against the flange 78 thereby ring 84. The activation of vacuum pump 104 further causes vapor to be drawn through outlet line 52 into space 98 of cold trap 86, and out of cold trap 86 through first outlet line 102. As previously specified, the cold trap 86 serves to rapidly polymerize residual parylene vapors.

Disposed within first outlet line 102 between vacuum pump 104 and container 88 is a flexible connection 108. Connected within first outlet line 102 between flexible connection 108 and, container 88 is a vacuum adjustment valve 110. The vacuum adjustment valve 110 includes a knob 112 attached thereto which is disposed on the top surface 12b of housing 12. As can be appreciated, through the manipulation of knob 112 by a user, the amount of vacuum exerted on the deposition system 10 by vacuum pump 104 may be manually controlled. Also disposed within first outlet line 102 between flexible connection 108 and vacuum adjustment valve 110 is a pressure transducer 114. Though not shown, pressure transducer 114 is electrically interfaced to a central processing unit disposed within the housing 12 so as to provide digital readouts to display screen 20 thereby giving the system user a readout of the system pressure levels. Also connected to container 88 is a second outlet line 116. Connected to second outlet line 116 is a vacuum bleed valve 118 which, like vacuum adjustment valve 110, includes a knob 120 attached thereto which is disposed on the top surface 12d of housing 12. When a deposition process has been completed, due to the vacuum created within the system, the lid 80 may not be easily removed from the deposition chamber 48 while such a vacuum is maintained. In this respect, the manipulation of knob 120 allows air to enter the system thereby eliminating the vacuum and allowing components such as lid 80, tubular member 92, and the cap disposed on entrance port 22 to be removed from their respective positions.

Connected to vacuum pump 104 is an outlet line 122 which is used to vent system air to the exterior of the housing 12. Importantly, connected within outlet line 22 is an oil after filter 124 which is used to remove any residual oil from the air which may have been injected therein by the vacuum pump 104 and/or motor 106.

As previously specified, included on the left side surface 12c of housing 12 are switches 24, 26 and 28. In the preferred embodiment, switoh 24 comprises an on/off switch for vacuum pump 104, switch 26 is an on/off switch for motor 68, and switch 28 is an on/off switch for oven 38. Though switches 24, 26 and 28 are used to provide power to respective components, a programmable central processing unit disposed within the housing 12 adjacent to display 20 is used to control the temperature and timing of the deposition system 10 through the control of the pyrolysis chamber 34, motor 68, pressure transducer 114, and vacuum pump 104 via motor 106. Additionally, the controller is able to provide the user with various displays via display screen 20 regarding system operating conditions. The housing 12 may further include a RS 232 port which is interfaced to the controller. As such, through the utilization of this port programs within the controller may be changed or modified.

Having thus described the components of the deposition system 10, the operation thereof will be described. Initially, a quantity of parylene dimer is introduced into vaporization chamber 32 via entrance port 22. After such introduction has occurred, the sealing cap is placed upon entrance port 22. The deposition process is initiated by activating both the heater 38 and motor 106 which in turn causes the activation of the vacuum pump 104. In the preferred embodiment, the heater 38 is set to an operating temperature of 400–700 degree C., and preferably 650 degrees C. When the set temperature of the heater 38 has been reached and the required vacuum has been achieved by the vacuum pump 104. the heaters of both vaporization chamber 32 and sealing cap are activated to start the process of sublimation of the dimer. In the preferred embodiment, aotivation of the aforementioned components is facilitated by the micro processor having stored programs therein which control system operation by a sequence of pre-programmed events however manual programming is contemplated. The activation of vacuum pump 104 creates a negative system pressure which causes the parylene material to be drawn from vaporization chamber 32 into the pyrolysis chamber 34, i.e. pipe 36. As the vaporized dimer passes through pipe 36, the heat provided by heater 38 causes the dimer to be further pyrolyzed to form the desired para-xylene-monomer. The vacuum created by vacuum pump 104 causes the parylene vapor to be drawn into deposition chamber 48 via inlet line 50. The vapor flows rotationally, axially upwardly through deposition chamber 48 and condenses, i.e. deposits, upon substrate articles positioned within the chamber 48, with any residual vapor exiting the chamber 48 via outlet line 52. After passing through outlet line 52, the vapor enters and circulates through the space 98 defined within cold trap 86. The flow through the cold trap 86 causes the condensation and polymerization of residual vapors which were not coated upon the substrates disposed upon the fixture rack within the deposition chamber 48. The vapor is then drawn from space 98 through first outlet line 102 and into the flexible connection 108. After circulating through vacuum pump 104, air is then vented to the exterior of housing 12 after passing through an oil after filter 124 which removes any residual oil added to the air by vacuum pump 104.

Although the invention is described here with respect to a preferred embodiment, numerous modifications and alterations may be made to the described embodiment without departing from the spirit and intended scope of the invention. Accordingly, it is intended to include any and all such modifications and alterations within the scope of the following claims and/or the equivalents thereof.

What is claimed is:

1. A tabler top parylene deposition system comprising:
   a unitary housing sized to be positionable upon a table top;
   a vaporization chamber disposed within said housing for vaporizing a quantity of di-para-xylylene dimer;
   a pyrolysis chamber disposed within said housing and connected to said vaporization chamber for pyrolyzing the vaporized dimer to form a reactive monomer vapor;
   a deposition chamber disposed within said housing and connected to said pyrolysis chamber for depositing said monomer vapor on desired substrates in a manner wherein the monomer vapor condenses on the substrates in the form of a polymer, said deposition chamber comprising:
   a generally cylindrical tank disposed within said housing and defining an interior chamber having a floor, an upper peripheral flange, a top portion and a bottom portion; and
   a lid selectively positionable upon and sealable against the flange of said tank, said lid being operable to enclose the interior chamber when sealed against the flange;
   said tank being connected to said pyrolysis chamber such that the monomer vapor will enter the bottom portion of the interior chamber tangentially and will thereafter flow upwardly in a generally rotational path about the interior chamber prior to exiting the top portion thereof;
   a cold trap disposed within said housing and connected to said deposition chamber for removing residual parylene from the monomer vapor; and
   a vacuum pump disposed within said housing and connected to said cold trap for maintaining continual negative pressure on the system such that the monomer vapor will flow through said deposition chamber.

2. The system of claim 1 wherein said deposition chamber further comprises a substrate support fixture positioned therein, said support fixture being pivotally articulable with and supported by the deposition chamber floor.

3. The system of claim 2 further comprising means disposed within said housing for rotating the substrate support fixture in a direction opposite the generally rotational flow path of the monomer vapor.

4. The system of claim 3 wherein said rotating means comprises:
   a shaft having a lower end and an upper end, the upper end extending through said chamber floor and being attached to said support fixture;
   a timing pulley connected to the lower end of said shaft;
   a drive belt disposed about said timing pulley;
   a drive shaft having an upper end and a lower end, the lower end being interfaced to said drive belt in a manner wherein the rotation of said drive shaft will cause the rotation of said pulley; and
   a motor connected to the upper and of said drive shaft;
   said motor being pivotally mounted to said housing so as to be movable between a drive position whereat said drive belt is maintained in tension between said drive shaft and said pulley and a relaxed position whereat said drive belt is removable from said drive shaft and said pulley.

5. The system of claim 3 wherein said substrate support fixture comprises a multi-tiered rack having a top plate, a bottom plate and a plurality of shelves positioned therebetween, said shelves being provided with perforations extending therethrough so as to permit the flow of monomer vapor therethrough.

6. The system of claim wherein said pyrolysis chamber comprises:
   a length of tube extending between said vaporization chamber and said deposition chamber, said tube being adapted to permit the vaporization dimer to flow therethrough; and
   a split heater positionable about the length of tube, said split heater comprising:
   a bottom member having a first surface defining a first elongate trough extending therethrough and a plurality of heating elements disposed adjacent said first trough; and
   a top member having a second surface defining a second elongate trough extending therethrough and a plurality of heating elements disposed adjacent said second trough;
   said bottom member and said top member being sized and configured such that when said first surface is abutted against said second surface said first trough and said second trough define an aperture adapted to receive said tube.

7. The system of claim 3 further comprising a programmable central processing unit disposed within said housing for controlling the operation of said pyrolysis chamber and said vacuum pump.

8. The device of claim 5 wherein said bottom plate comprises:
   a fixture plate having a first set of apertures disposed therein; and
   a secondary plate having a second set of apertures disposed therein, said secondary plate being rotatably attached to said fixture plate in a manner wherein said first set of apertures and said second set of apertures may be selectively aligned so as to control the rate of vapor flow through said bottom plate.

9. The device of claim 8 further comprising means for selectively adjusting the position of said secondary plate relative said fixture plate.

10. The device of claim 9 wherein said adjusting means comprises a locating pin disposed within said secondary plate and a plurality of apertures disposed about the outer periphery of said fixture plate, said locating pin being selectively receivable into any one of said peripheral apertures.

11. A table top parylene deposition system comprising:
- a housing sized to be positionable upon a table top;
- a vaporization chamber disposed within said housing for vaporizing a quantity of di-para-xylylene dimer;
- a pyrolysis chamber disposed within said housing and connected to said vaporization chamber for pyrolyzing the vaporized dimer to form a reactive monomer vapor;
- a deposition chamber disposed within said housing and connected to said pyrolysis chamber for depositing said monomer vapor on desired substrates in a manner wherein the monomer vapor condenses on the substrates in the form of a polymer, said deposition chamber comprising:
  - a generally cylindrical tank having a floor and a cylindrical inner side wall; and
  - a lid positionable upon said tank, said lid being alternatively moveable between a closed position and an open position;
  - said deposition chamber being connected to said pyrolysis chamber such that the monomer vapor will enter the deposition chamber tangentially and will thereafter flow in a generally rotational path about the interior of the chamber;
- a vacuum pump disposed within said housing and connected to said deposition chamber for maintaining continual negative pressure on the system such that the monomer vapor will flow through said deposition chamber;
- a substrate support fixture positioned within said deposition chamber, said substrate support fixture being pivotally articulable with and supported by the deposition chamber floor; and
- means disposed within said housing for rotating the substrate support fixture in a direction opposite the generally rotational flow path of the monomer vapor, said rotating means comprising:
  - a shaft having a lower end and an upper end, the upper end extending through said chamber floor and being attached to said support fixture;
  - a timing pulley connected to the lower end of said shaft;
  - a drive belt disposed about said timing pulley;
  - a drive shaft having an upper end and a lower end, the lower end being interfaced to said drive belt in a manner wherein the rotation of said drive shaft will cause the rotation of said pulley;
  - a motor connected to the upper end of said drive shaft;
  - said motor being pivotally mounted to said housing so as to be moveable between a drive position whereat said drive belt is maintained in tension between said drive shaft and said pulley and a relaxed position whereat said drive belt is removable from said drive shaft and said pulley.

12. A table top parylene deposition system comprising:
- a housing sized o be positionable upon a table top;
- a vaporization chamber disposed within said housing for vaporizing a quantity of di-para-xylylene dimer;
- a pyrolysis chamber disposed within said housing and connected to said vaporization for pyrolyzing the vaporized dimer to form a reactive monomer vapor;
- a deposition chamber disposed within said housing and connected to said pyrolysis chamber for depositing said monomer vapor on desired substrates in a manner wherein the monomer vapor condenses on the substrates in the form of a polymer, said deposition chamber comprising:
  - a generally cylindrical tank having a floor and a cylindrical inner side wall; and
  - a lid positionable upon said tank, said lid being alternatively moveable between a closed position and an open position;
  - said deposition chamber being connected to said pyrolysis chamber such that the monomer vapor will enter the deposition chamber tangentially and will thereafter flow in a generally rotational path about the interior of the chamber;
- a vacuum pump disposed within said housing and connected to said deposition chamber for maintaining continual negative pressure on the system such that the monomer vapor will flow through the deposition chamber;
- a substrate support fixture positioned within said deposition chamber, said support fixture being pivotally articulable with and supported by the deposition chamber floor and comprising:
  - a multi-tiered rack having a top plate, a bottom plate and a plurality of shelves positioned therebetween, said shelves being provided with perforations extending therethrough so as to permit the flow of monomer vapor therethrough;
- means disposed within said housing for rotating the substrate support fixture in a direction opposite the generally rotational flow path of the monomer vapor.

13. The device of claim 12 wherein said bottom plate comprises:
- a fixture plate having a first set of apertures disposed therein; and
- a secondary plate having a second set of apertures disposed therein, said secondary plate being rotatably attached to said fixture plate in a manner wherein said first set of apertures and said second set of apertures may be selectively aligned so as to control the rate of vapor flow through said bottom plate.

14. The device of claim 13 further comprising means for selectively adjusting the position of said secondary plate relative to said fixture plate.

15. The device of claim 14 wherein said adjusting means comprises a locating pin disposed within said secondary plate and a plurality of apertures disposed about the outer periphery of said fixture plate, said locating pin being selectively receivable into any one of said peripheral apertures.

16. The system of claim 12 wherein said pyrolysis chamber comprises:
- a length of tube extending between said vaporization chamber and said deposition chamber, said tube being adapted to permit the vaporization dimer to flow therethrough; and
- a split heater positionable about the length of tube, said split heater comprising:
  - a bottom member having a first surface defining a first elongate trough extending therethrough and a plurality of heating elements disposed adjacent said first trough; and a top member having a second surface defining a second elongate trough extending therethrough and a plurality of heating elements disposed adjacent said second trough;

said bottom member and said top member being sized and configured such that when said first surface is abutted against said second surface, said first trough and said second trough define an aperture adapted to receive said tube.

17. The system of claim 12 further comprising a programmable central processing unit disposed within said housing for controlling the operation of said pyrolysis chamber and said vacuum pump.

* * * * *